United States Patent [19]
Sanada

[11] Patent Number: 5,889,789
[45] Date of Patent: Mar. 30, 1999

[54] FAULT MODE ESTIMATING SYSTEM USING ABNORMAL CURRENT AND V-I CHARACTERISTICS

[75] Inventor: Masaru Sanada, Tokyo, Japan

[73] Assignee: NEC Coporation, Tokyo, Japan

[21] Appl. No.: 672,925

[22] Filed: Jun. 28, 1996

[30] Foreign Application Priority Data

Jun. 30, 1995 [JP] Japan ..................................... 7-165118
Jul. 24, 1995 [JP] Japan ..................................... 7-186973

[51] Int. Cl.⁶ ..................................................... G02R 31/28
[52] U.S. Cl. .............................................. 371/28; 371/25.1
[58] Field of Search .............................. 371/26, 25.1, 28; 324/765, 769

[56] References Cited

U.S. PATENT DOCUMENTS 5,321,354  6/1994  Ooshima et al. ........................ 324/765

FOREIGN PATENT DOCUMENTS 35 16755 A1  5/1985  Germany .
57-56764A    7/1982  Japan .
4-66884      3/1992  Japan .

OTHER PUBLICATIONS

M. Sanada, "New Application of Laser Beam to Failure Anhalysis of LSI with Multi–Metal Layers," Microelectron Reliab, vol.33, No. 7, pp, 993–1009, 1993.
M. Sanada, "Evaluation and Detection of MOS–LSI with Abnormal IDDQ," Microelectron Reliab., vol.35, No.3, pp. 619–629, 1995.
H. Ishizuka, et al., "Study of Failure Analysis Using Photon Spectrum," pp. 71–76.

*Primary Examiner*—Albert DeCady
*Attorney, Agent, or Firm*—Foley & Lardner

[57] ABSTRACT

In a system for estimating a failure mode in a semiconductor device, at least one special functional test pattern is generated and transmitted to the semiconductor device. If an abnormal current is detected, V-I characteristics of the semiconductor device are detected, and are compared with reference V-I characteristics for a special failure mode, thereby estimating that the specified failure mode has occurred.

18 Claims, 23 Drawing Sheets

| IN 1 | IN 2 | OUT |
|---|---|---|
| L | L | H |
| L | H | L |
| H | L | L |
| H | H | L |

| IN 1 | IN 2 | OUT |
|---|---|---|
| L | L | ABNORMAL ($V_{DD}/3$) |
| L | H | L |
| H | L | L |
| H | H | L |

Fig. 9A

| | V | I |
|---|---|---|
| a | $V_a$ | $\simeq 0$ |
| b | $V_b$ | $I_b$ |
| c | $V_c$ | $I_c$ |
| d | $V_d$ | $I_d$ |

Fig. 9B

| | GRADIENT VALUE |
|---|---|
| $\alpha$ | $I_b / (V_b - V_a)$ |
| $\beta$ | $(I_c - I_b) / (V_c - V_b)$ |
| $\gamma$ | $(I_d - I_c) / (V_d - V_c)$ |

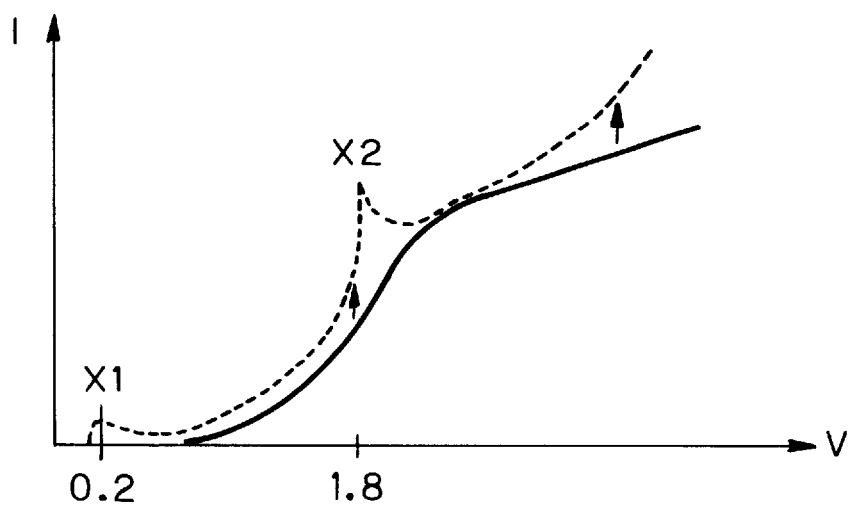

FROM COMPUTER 6

FAULT MODE ESTIMATING SYSTEM USING ABNORMAL CURRENT AND V-I CHARACTERISTICS

RELATED U.S. PATENT APPLICATIONS

The instant U.S. patent application is related to U.S. patent application Ser. Nos. 08/588,136 and 08/612,825.

BACKGROUND OF THE INVENTION

1. Field of the Invention

The present invention relates to a system for estimating a fault mode in a semiconductor device such as a CMOS integrated device.

2. Description of the Related Art

In a first prior art system for detecting a failure mode in a semiconductor device, an electron beam is incident to the device, and as a result, a potential map or the like is obtained by detecting secondary electrons generated from the device. Then, a fault mode is detected by observing the device with an optical microscope, by etching the device with a laser beam or by cutting the device with a focused ion beam (FIB).

In the first prior art system, however, since determination of a fault mode is carried out by using physical analysis, it takes a lot of time to completely determine a fault mode.

A second prior art system for detecting a failure mode in a semiconductor device uses an optical emission microscope having a function for accumulating detected light (sees H. Ishizuka at al., "STUDY OF FAILURE ANALYSIS USING PHOTON SPECTRUM", REAJ 4-TH SYMPOSIUM, VoL. 13, No. 3, pp.71–76, November 1991). This will be explained later in detail.

In the second prior art system, however, detected failure modes are limited to an open failure mode of a gate electrode, a leakage failure mode by the destruction of a gate oxide layer, and a short-circuit node between connections by a high resistance conductor, for example. Also, it is impossible to accurately estimate a failure mode, since the emission spectrum of one failure mode is similar to the emission spectrum of another failure mode. Further, it is necessary to specify a fault point before the analysis by the optical emssion mictroscope. Further, if a fault point is beneath a conductive layer, it is impossible to detect light generated from such a fault point, since the light is reflected by the conductive layer. In addition, when a leakage current flowing through a fault point is so large as to remarkably increase the light intensity, it is impossible to normally operate the optical emission microscope.

In a third prior art system for detecting a failure mode in a semiconductor device, a signal waveform is obtained by an electron beam or a laser beam or by a direct probing using a metal needle, and is compared with a simulated waveform. As a result, if the signal waveform is different from the simulated waveform, a logic simulation is carried out to determine a fault mods.

In the third prior art system, however, it takes a lot of time to determine a fault mode, since a large amount of time is required to analyze the result of the logic simulation.

SUMMARY OF THE INVENTION

It is an object of the present invention to easily and rapidly estimate a failure mode in a semiconductor device.

According to the present invention, in a system for estimating a failure mode in a semiconductor device, functional test patterns are generated and transmitted to the semiconductor device. If an abnormal current is detected, V-I characteristics of the semiconductor device are detected, and are compared with reference V-I characteristics for a special failure mode, thereby estimating that the specified failure mode has occurred.

BRIEF DESCRIPTION OF THE DRAWINGS

The present invention will be more clearly understood from the description as set forth below, as compared with the prior art, with reference to the accomaying drawings, wherein:

FIGS. 9A and 9B are tables of parameters showing the V-I characteristics of FIG. 8B;

FIGS. 17A, 17B and 17C are timing diagrams showing the voltage applied to the device of FIG. 5;

FIG. 18 is a diagram showing a third example of the V-I characteristics at step 608 of FIG. 6;

DESCRIPTION OF THE PREFERRED EMBODIMENT

Before the description of the preferred embodiment, a prior art fault mode detecting apparatus will be explained with reference to FIGS. 1 and 2 (see: H. Ishizuka et al., "STUDY OF FAILURE ANALYSIS USING PHOTON SPECTRUM", REAJ 4-TH SYMPOSIUM, Vol. 13, No. 3, pp. 71–76, November 1991).

Figure 1:
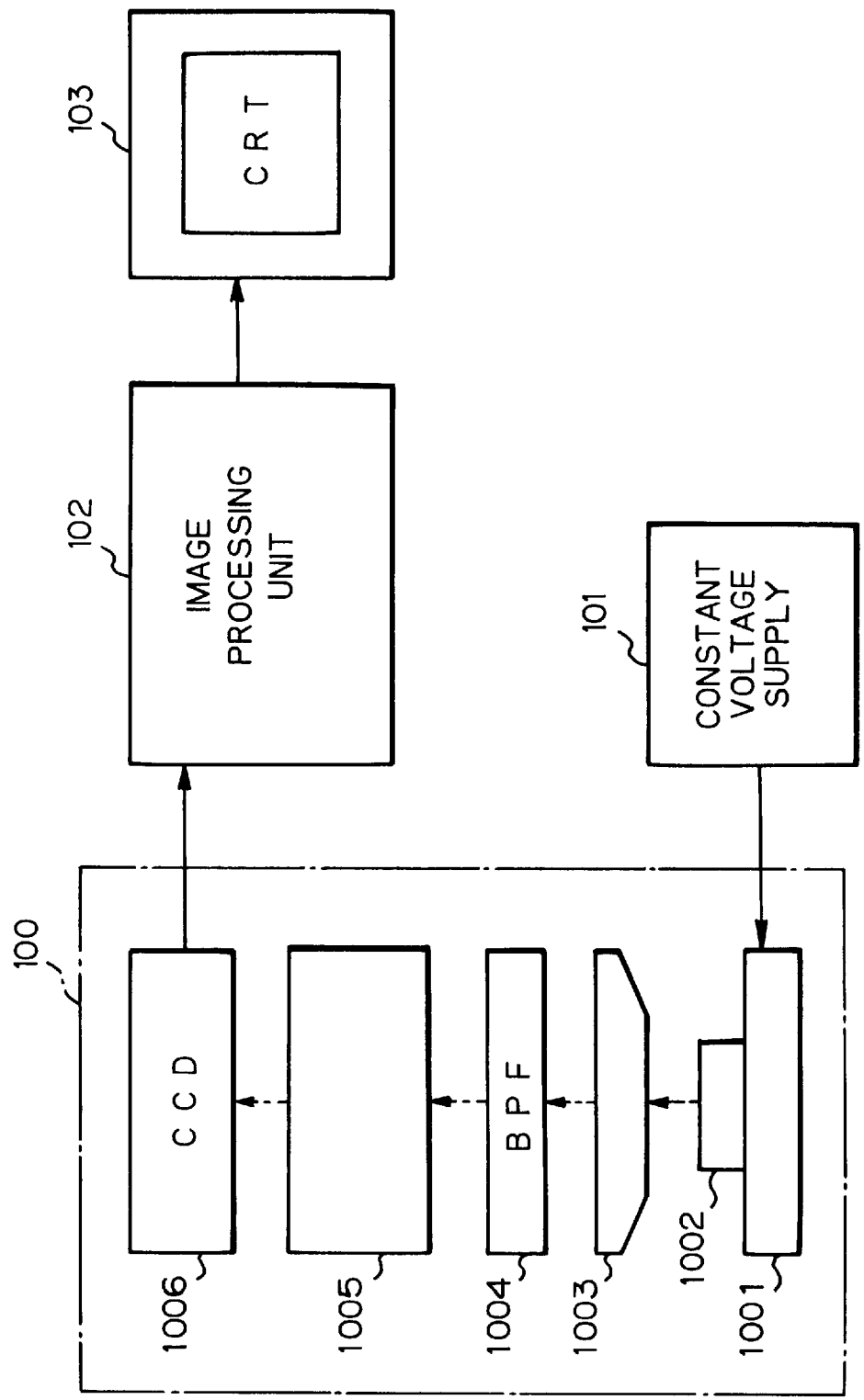
FIG. 1 is a block diagram illustrating a prior art fault mode detecting apparatus.
Figure 2:
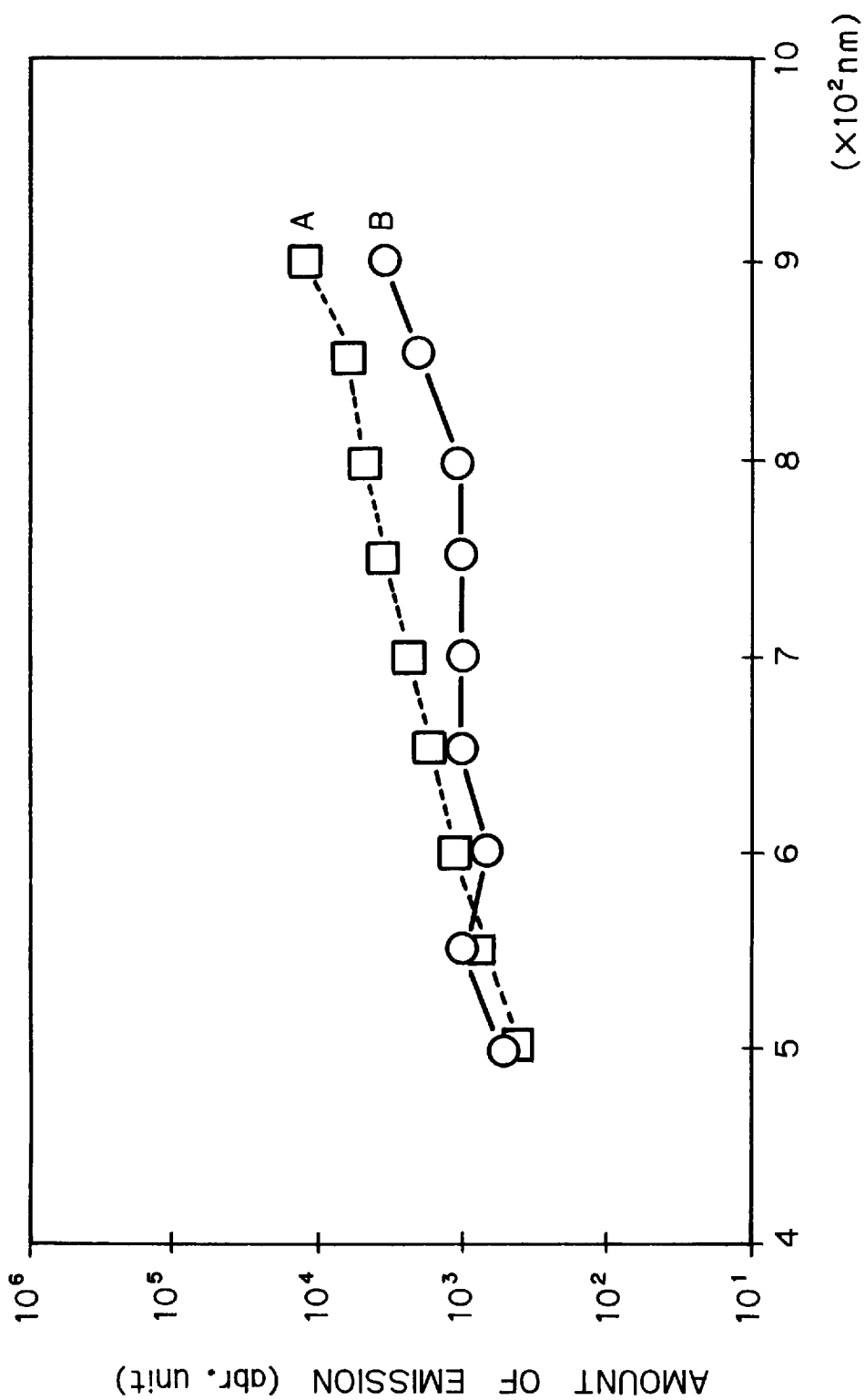
FIG. 2 is a graph showirng an emission spectrum obtained by the apparatus of FIG. 1.

In FIG. 1, a dark room 100 incorporates a device under test (DUT) board 1001, a CMOS semiconductor device 1002 mounted on the DUT board 1001, an optical emission microscope 1003, a band-pass filter 1004, a font amplifier tube 1005 which is called an image intensifier, and a charge-coupled device (CCD) camera 1006. A constant voltage is supplied by a constant voltage supply 101 to the DUT board 1001. As a result, weak light generated from a fault point of the semiconductor device 1002 is supplied via the optical emission microscope 1003 and the band-pass filter 1004 to the font amplifier tube 1005. Then, the weak light is amplified by the font amplifier tube 1005 and is supplied to an image processing unit 102 for analyzing the amplified light. An image obtained by analyzing the amplified light, i.e., an emission spectrum is displayed on a display unit 103. In this case, the optical emission microscope 1003 has a function for accumulating detected light. Thus, a failure mode can be estimated by observing the emission spectrum displayed on the display unit 103.

In the apparatus of FIG. 1, however, since the wavelength of the band-pass filter 1004 is limited to 400 to 1000 nm, for example, the detected failure modes are limited to an open failure mode of a gate electrode, a leakage failure mode by the destruction of a gate oxide layer and a short-circuit mode between connections by a high resistance conductor, for example.

Also, in the apparatus of FIG. 1, it is impossible to accurately estimate a failure mode, since the emission spectrum of one failure mode is similar to the emission spectrum of another failure mode. For example, as shown in FIG. 2, the emission spectrum of a gate insulating layer failure mode as indicated by A is similar to that of a gate electrode opening failure mode as indicated by B. Therefore, in view of the fluctuation of the emission spectrum, it is difficult to accurately discriminate one failure mode from another failure mode.

Further, it is necessary to specify a fault point before the analysis by the optical emission microscope. That is, after such a fault point is specified, the emission spectrum of light generated from the fault point is analyzed. Therefore, it takes a large amount of time to estimate the failure mode of the fault point.

Further, if a fault point is beneath a conductive layer, it is impossible to detect light generated from such a fault point, since the light is reflected by the conductive layer.

In addition, when a leakage current flowing through a fault point is so large as to remarkably increase the light intensity, it is impossible to normally operate the optical emission microscope 1003.

Next, a principle of the present invention will be explained with reference to FIGS. 3A, 3B, 4A and 4B.

Figures 3A, 3B:
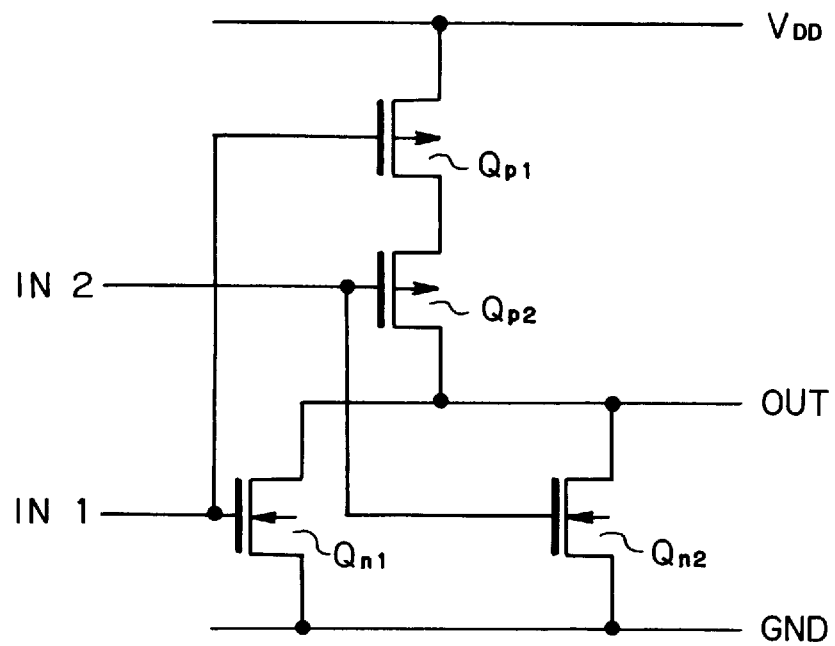
FIG. 3A is a circuit diagram illustrating a normal two-input CMOS NOR circuit.
FIG. 3B is a truth table of the circuit of FIG. 3A.

In FIG. 3A, which illustrates a normal two-input CMOS NOR circuit, P-channel MOS transistors $Q_{p1}$ and $Q_{p2}$ are connected in series between a power supply terminal $V_{DD}$ and an output terminal OUT, and N-channel MOS transistors $Q_{n1}$ and $Q_{n2}$ are connected in parallel between the output terminal OUT and a ground terminal GND. The transistors $Q_{p1}$ and $Q_{n1}$ are controlled by the voltage of an input terminal IN1, and the transistors $Q_{p2}$ and $Q_{n2}$ are controlled by the voltage of an input terminal IN2. The truth table of the NOR circuit of FIG. 3A is shown in FIG. 3B.

In FIG. 3A, there is no quiescent $V_{DD}$ supply current $I_{ddq}$ flowing from the power supply terminal $V_{DD}$ to the ground terminal GND. That is, the quiescent $V_{DD}$ supply current $I_{ddq}$ is in a normal state.

Figures 4A, 4B:
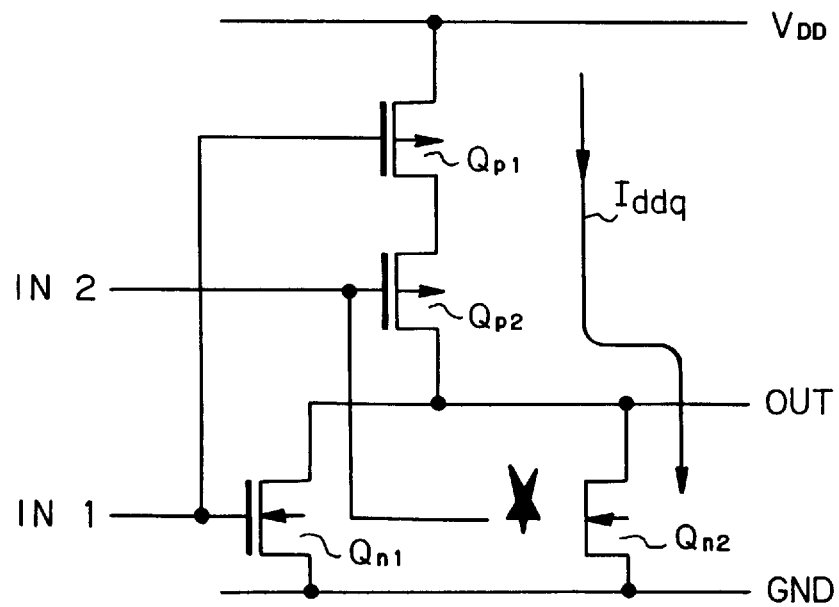
FIG. 4A is a circuit diagram illustrating a normal two-input CMOS NOR circuit.
FIG. 4B is a truth table of the circuit of FIG. 4A.

In FIG. 4A, which illustrates an abnormal two-input CMOS NOR circuit, assume that the gate of the N-channel transistor $Q_{n2}$ is open, so that the N-channel transistor $Q_{n2}$ is in a normally ON state. As a result, when the voltages at the input terminals IN1 and IN2 are both low, a penetration current, i.e., a large quiescent $V_{DD}$ supply current $I_{ddq}$ flows. That is, the quiescent $V_{DD}$ supply current $I_{ddq}$ is in an abnormal state.

Also, in FIG. 4A, when the voltages at the input terminals IN1 and IN2 are both low, the voltage $V_{out}$ at the output terminal OUT is $$V_{OUT} = V_{DD} \cdot (Z_n)/(2 \cdot Z_p + Z_n)$$

where $Z_p$ is an impedance of the P-channel transistor $Q_{p2}$;
$Z_n$ is an impedance of each of the N-channel transistors $Q_{n1}$ and $Q_{n2}$; and
$V_{th}$ is a logic threshold voltage of a CMOS inverter. If $Z_p = Z_n$, then $$V_{OUT} = (1/3)V_{DD} < V_{th}$$

Therefore, the truth table of the NOR circuit of FIG. 4A is shown in FIG. 4B.

Thus, generally, if a semiconductor device such as a CMOS device has a physical defect therein, an abnormal quiescent $V_{DD}$ supply current flows therethrough (see; M. Sanada, "New Application of Laser Beam to Failure Analysis of LSI with Multi-Metal Layers", Microelectronics and Reliability, Vol. 33, No. 7, pp. 993–1009, 1993, and M. Sanada, "Evaluation and Detection of CMOS-LSI with Abnormal IDDQ", Microelectronics and Reliability, Vol. 35, No. 3, pp. 619–629, 1995).

Figure 5:
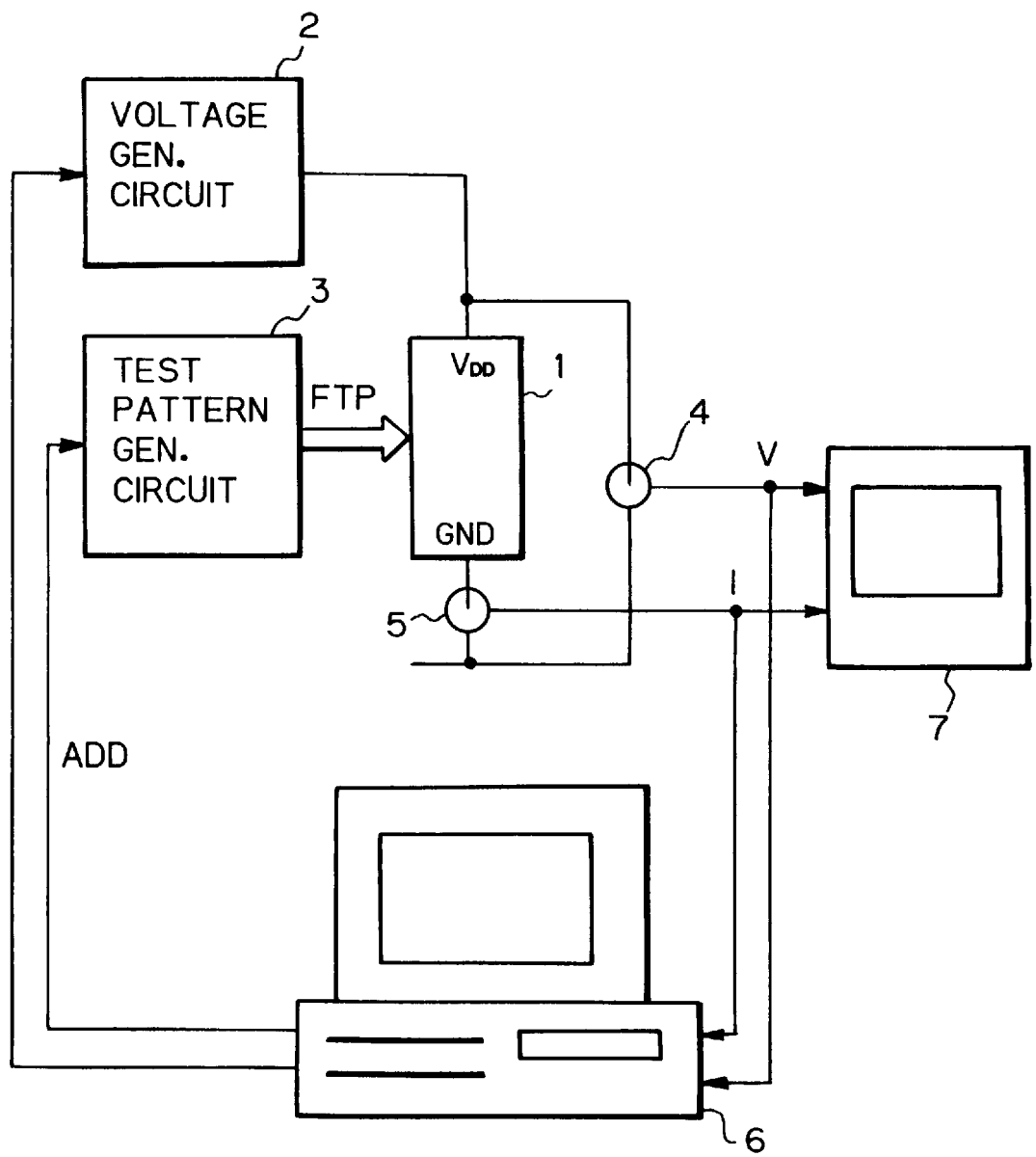
FIG. 5 is a block diagram illustrating an embodiment of the failure mode estimating apparatus according to the present invention.

In FIG. 5, which illustrates an embodiment of the present invention, reference numeral 1 designates a semiconductor device such as a CMOS LSI circuit device. A voltage V is applied by a voltage generating circuit 2 to a power supply voltage terminal $V_{DD}$ of the device 1, and a functional test pattern FTP is supplied by a test pattern generating circuit 3 to inputs of the device 1.

A voltage between the power supply voltage terminal $V_{DD}$ and a ground terminal GND is detected by a voltage detector 4. Also, a current flowing from the power supply terminal $V_{DD}$ to the ground terminal GND is detected by a current detector 5. A voltage V detected by the voltage detector 4 and a current I detected by the current detector 5 are supplied to a computer 6 and a curve tracer 7 for displaying a V-I curve depending upon the voltage V and the current I.

The computer 6 is comprised of a central processing unit (CPU), a read-only memory (ROM), a random access memory (RAM), a display unit and the like. The computer 6 controls the voltage generating circuit 2 and the test pattern generating circuit 3.

Figure 6:
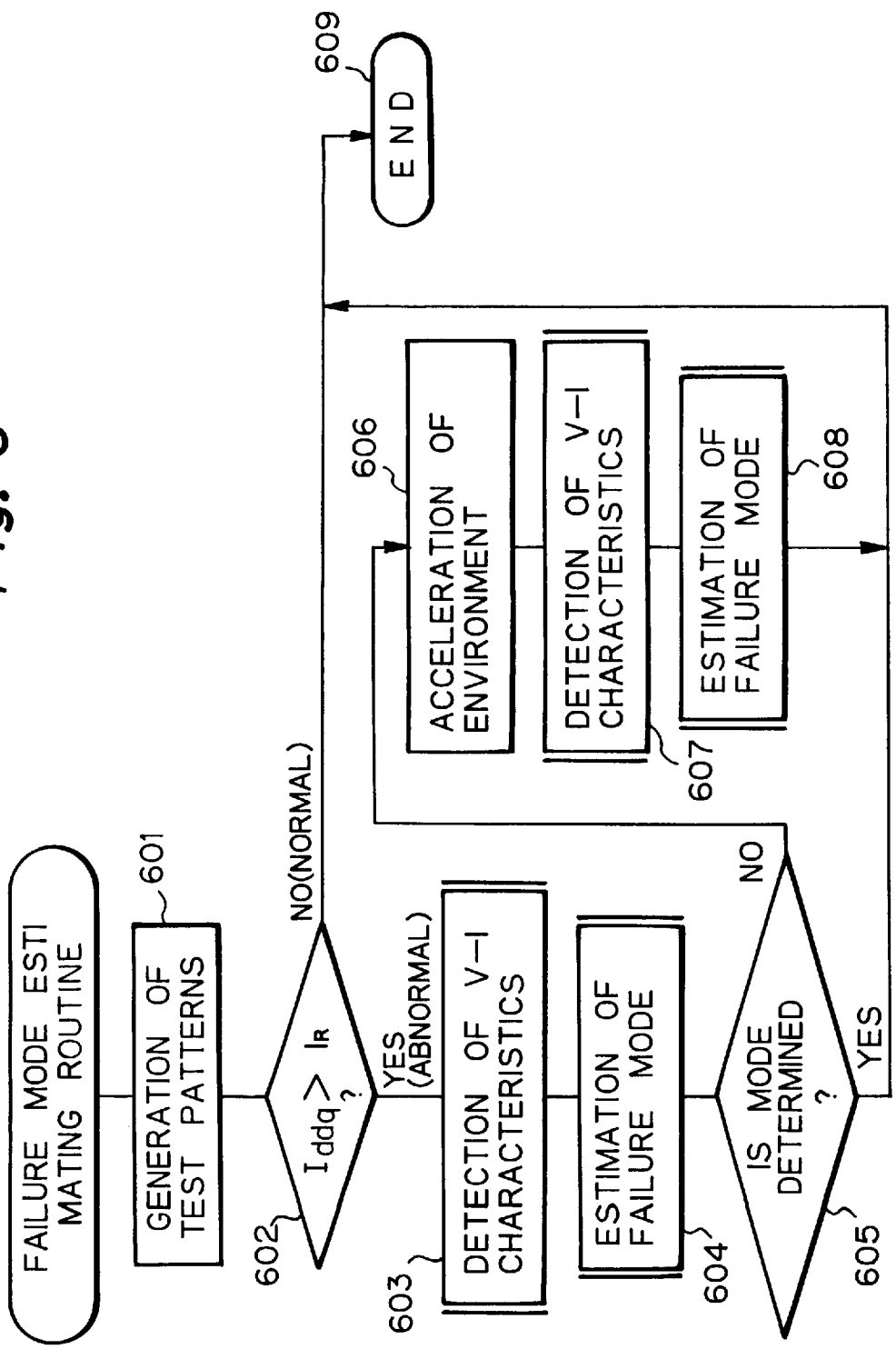
FIG. 6 is a flowchart showing the operation of the computer of FIG. 5.

The operation of the computer 6 of FIG. 5 is explained next with reference to a flowchart as shown in FIG. 6. Note that the test pattern generating circuit 3 incorporates a ROM for storing functional test patterns FTP which are a function of an address ADD.

First, at step 601, the test pattern generating circuit 3 generates a specific functional test pattern PTP. Note that as occasion demands, a plurality of specific functional test patterns can be generated.

Figure 7:
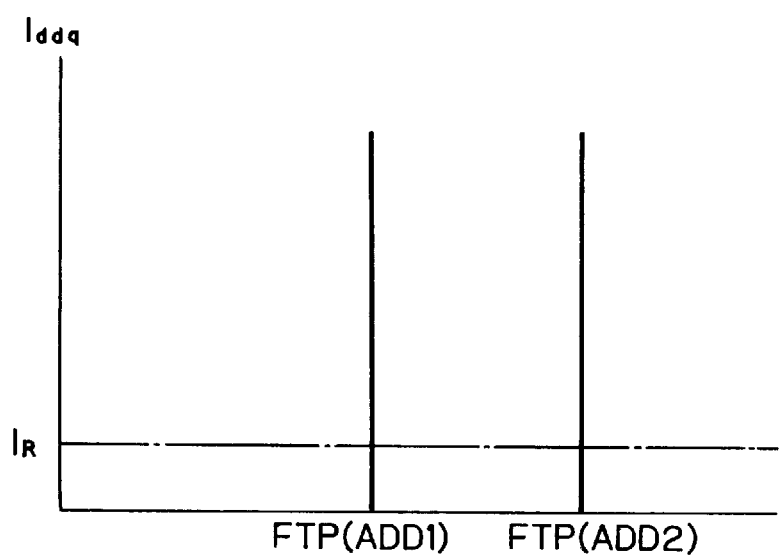
FIG. 7 is a quiescent $V_{DD}$ supply current diagram for explaining the flowchart of FIG. 6.

At step 602, it is determined whether or not a current I, which is called a quiescent $V_{DD}$ supply currant $I_{ddq}$ is extremely large, i.e., abnormal. Concretely, as shown in FIG. 7, it is determined whether or not the current $I_{ddq}$ is larger than a reference current $I_R$, when the functional test patterns FTP are supplied to the device 1. As a result, if $I_{ddq} > I_R$ (abnormal), the control proceeds to step 603. Otherwise, the control proceeds directly to step 609.

Figure 8A:
FIGS. 8A and 8B are diagrams showing an example of V-I characteristics at step 603 of FIG. 6.
Figure 8B:
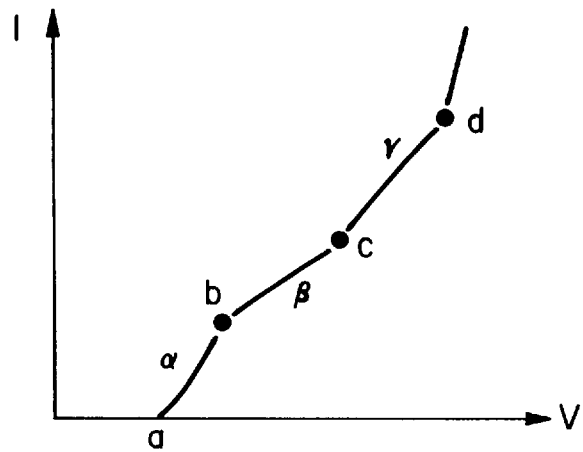

At step 603, V-I characteristics are obtained while the functional test pattern FTP is fixed. That is, when the voltage V applied to the power supply voltage terminal $V_{DD}$ of the device 1 is gradually increased, an example of V-I characteristics can be obtained as shown in FIG. 8A. Then, singular points a, b, c and d as shown in FIG. 8B are extracted from the V-I characteristics. Finally, as shown in FIGS. 9A and 9B, a gradient value $\alpha$ between the singular points a and b, a gradient value $\beta$ between the singular points b and c, and a gradient value $\tau$ between the singular points c and d are calculated. That is, the number of gradient values is the number of singular points minus 1. Also, the number of singular points is dependent upon V-I characteristics. However, if there is only one singular point, one gradient value is calculated between this singular point and a predetermined point on the V-I characteristics. For example, in FIG. 8B, the V-I characteristics are represented by four singular points a, b, c and d and three gradient values $\alpha$, $\beta$ and $\tau$.

Next, at step 604, a failure mode is estimated by comparing the singular points and the gradient values of the V-I characteristics with singular points and gradient values of predetermined failure modes. This will be explained later in detail.

At step 605, it is determined whether or not a failure mode is determined at step 604. If a failure mode is determined, the control proceeds to step 609. Otherwise, the control proceeds to steps 606, 607 and 608 which carry out another estimation of failure modes.

At step 606, a physical environment is changed or accelerated. At step 607, V-I characteristics in an accelerated physical environment are obtained in the same way as at step 603. At step 608, a failure mode is estimated. Steps 606, 607 and 608 will be explained later in detail. Then, the control proceeds to step 609.

Then, the routine of FIG. 6 is completed by step 609.

Figure 10:
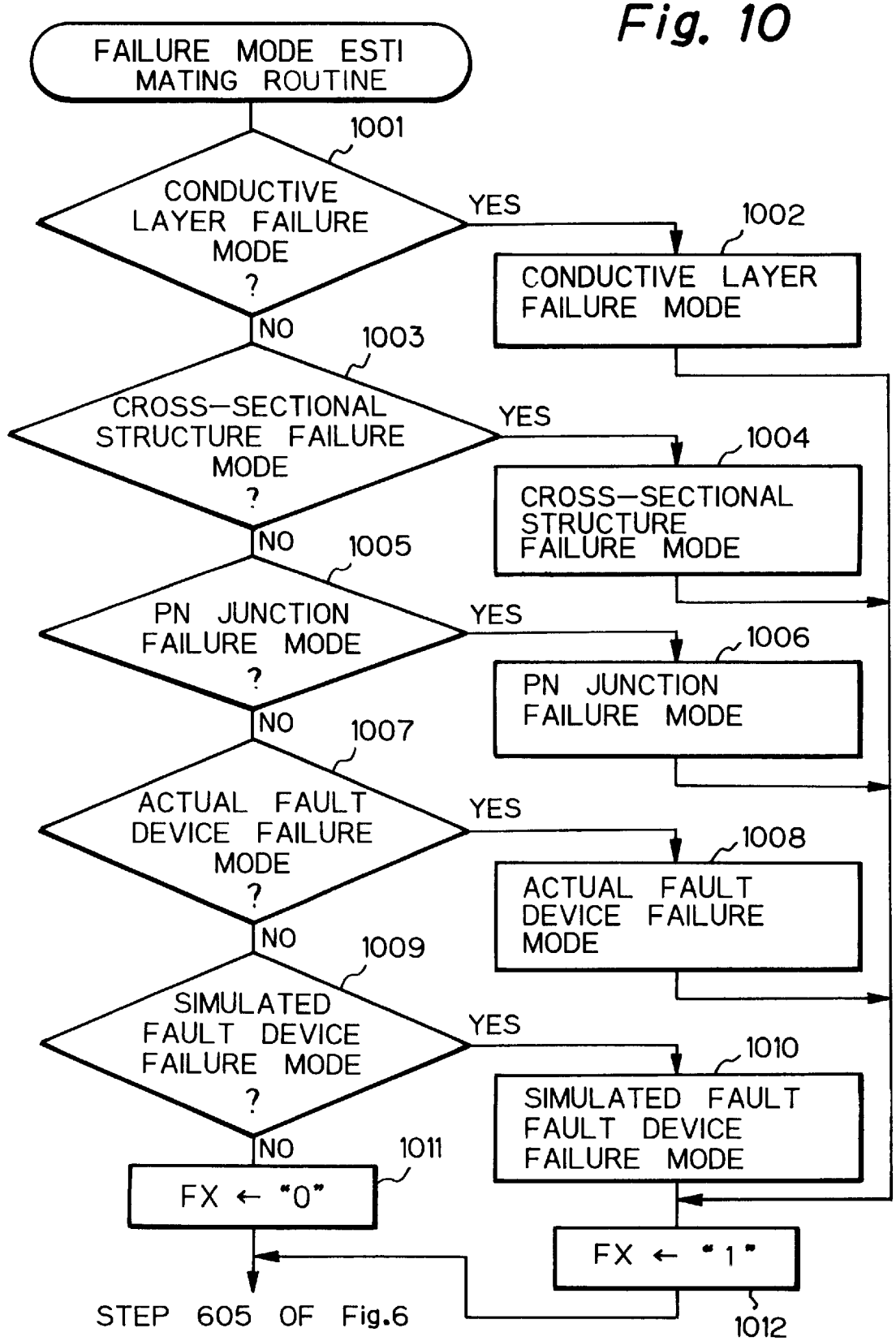
FIG. 10 is a detailed flowchart of step 604 of FIG. 6.

The failure mode estimating step 604 of FIG. 6 is explained next with reference to FIG. 10.

Figure 11C:
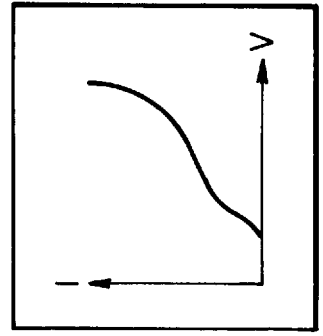
FIGS. 11A, 11B and 11C are diagrams showing examples of V-I characteristics for explaining conductive layer failure modes of FIG. 10.
Figure 11B:
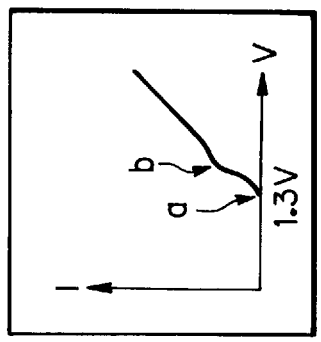

First, at step 1001, it is determined whether or not a conductive layer failure mode is present. In this case, one or more V-I characteristics showing a conductive layer failure mode as shown in FIGS. 1A, 11B and 11C are stored as a database in the RAM of the computer 6. It is then determined whether or not the singular points calculated at step 603 are close to those for a conductive layer failure mode. Only if the singular points are close, is it determined whether or not the gradient values calculated at step 603 are close to the gradient values showing a conductive layer failure mode. As a result, if the calculated gradient values are close to those showing a conductive layer failure mode, the control proceeds to step 1002 which determines that a conductive layer failure mode has occurred. Then, the control returns via step 1012 to step 605 of FIG. 5. Otherwise, the control proceeds to step 1003.

Figure 11D:
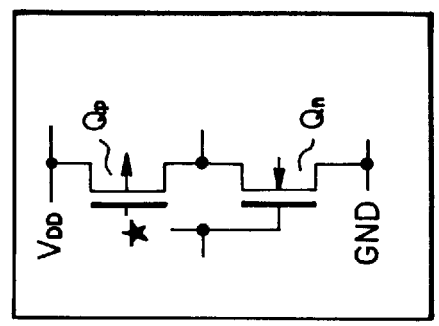
FIG. 11D is a circuit diagram for explaining the V-I characteristiscs of FIG. 11A.
Figure 11A:
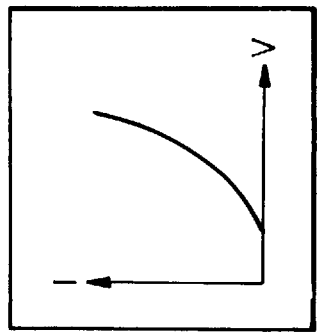

Note that a conductive layer failure mode can be forcibly made in the device 1 by using a focused ion beam (FIB) or focused laser beam (FLB). For example, as shown in FIG. 11D, an open failure mode is forcibly made in a gate electrode of a P-channel MOS transistor $Q_p$ of a CMOS inverter. In FIG. 11D, when a high input voltage is applied to the CMOS inverter, the P-channel MOS transistor $Q_p$ is normally in an ON state and an N-channel MOS transistor $Q_n$ is turned ON, so that a penetration current flows through the transistors $Q_p$ and $Q_n$. Also, such a penetration current begins to flow when the input voltage reaches a threshold voltage such as about 1.3 V of the N-channel MOS transistor $Q_n$. In addition, a gradient value of the V-I characteristics is dependent upon a sum of a channel resistance of the P-channel MOS transistor $Q_p$ and a channel resistance of the N-channel MOS transistor $Q_n$. Thus, an open failure mode as shown in FIG. 11D has the V-I characteristics as shown in FIG. 11B, where two singular points a and b are generated and a gradient value therebetween is relatively large.

Figure 12A:
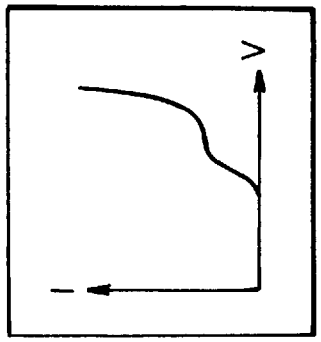
FIGS. 12A, 12B and 12C are diagrams showing examples of V-I characteristics for explaining cross-sectional structure failure modes of FIG. 10.
Figure 12B:
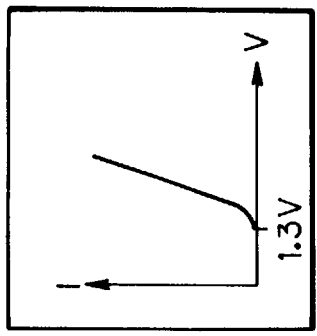
Figure 12C:
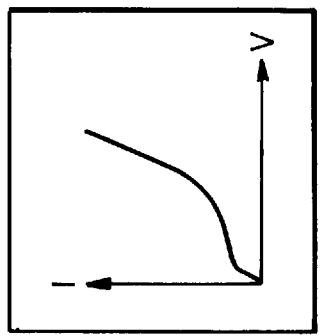

At stop 1003, it is determined whether or not a cross-sectional structure failure mode is present. In this case, one or more V-I characteristics showing a cross-sectional structure failure mode as shown in FIGS. 12A, 12B and 12C are stored as a database in the RAM of the computer 6. It is then determined whether or not the singular points calculated at step 603 are close to those for a cross-sectional structure failure mode. Only if the singular points are close, is it determined whether or not the gradient values calculated at step 603 are close to the gradient values showing a cross-sectional structure failure mode. As a result, if the calculated gradient values are close to those showing a cross-sectional structure failure mode, the control proceeds to step 1004 which determines that a cross-sectional structure failure mode has occurred. Then, the control returns via step 1012 to step 605 of FIG. 5. Otherwise, the control proceeds to step 1005.

Figure 12E:
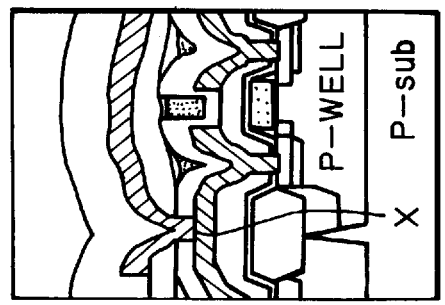
FIG. 12E is a cross-sectional view for explaining the V-I characteristics of FIG. 12B.
Figure 12D:
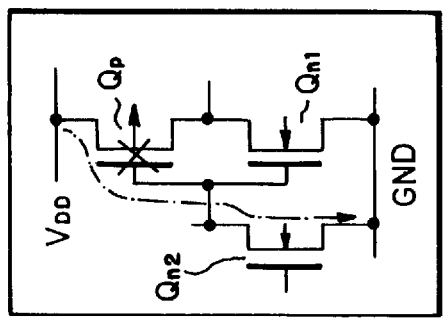
FIG. 12D is a circuit diagram for explaining the V-I characteristiscs of FIG. 12B.

Note that a cross-sectional structure failure mode can be forcibly made in the device 1 by using an FIB or FLB. For example, as shown in FIGS. 12D and 12E, a short-circuit failure mode is forcibly made in a gate insulating layer of a P-channel MOS transistor $Q_p$ of a CMOS inverter by forming a pinhole therein as indicated by X. In FIG. 12D, when a low input voltage is applied to the CMOS inverter as well as an N-channel MOS transistor $Q_{n1}$ thereof, a penetration current flows from the power supply voltage terminal $V_{DD}$ via the pinhole of the gate insulating layer of the P-channel MOS transistor $Q_p$ and a drain of an N-channel MOS transistor $Q_{n2}$ for defining the input voltage, to the source thereof, i.e., to the ground terminal GND. Also, such a penetration current begins to flow when the gate voltage of the N-channel MOS transistor $Q_{n2}$ reaches a threshold voltage such as about 1.3 V of the N-channel Mos transistor $Q_{n2}$. In addition, a gradient value of the V-I characteristics is dependent upon a sum of a resistance of the pinhole of the gate insulating layer of the P-channel MOS transistor $Q_p$ and a channel resistance of the N-channel MOS transistor $Q_{n2}$. Thus, a short-circuit failure mode as shown in FIG. 12D has the V-I characteristics as shown in FIG. 12B, where one singular point is generated and one gradient value is relatively large.

Figure 13C:
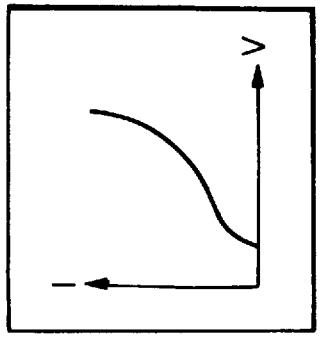
FIGS. 13A, 13B and 13C are diagrams showing examples of V-I characteristics for explaining PN junction failure modes of FIG. 10.
Figure 13B:
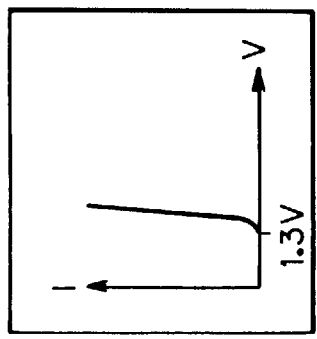
Figure 13A:
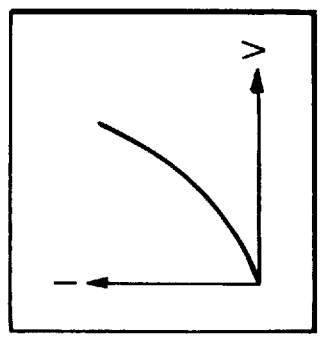

At step 1005, it is determined whether or not a PN junction failure mode is present. In this case, one or more V-I characteristics showing a PN junction failure mode as shown in FIGS. 13A, 13B and 13C are stored as a database in the RAM of the computer 6. It is then determined whether or not the singular points calculated at step 603 are close to those for a PN junction failure mode. Only if the singular points are close, is it determined whether or not the gradient values calculated at step 603 are close to the gradient values showing a PN junction failure mode. As a result, if the calculated gradient values are close to those showing a PN junction failure mode, the control proceeds to step 1006 which determines that a PN junction failure mode has occurred. Then, the control returns via step 1012 to step 605 of FIG. 5. Otherwise, the control proceeds to step 1007.

Figure 13E:
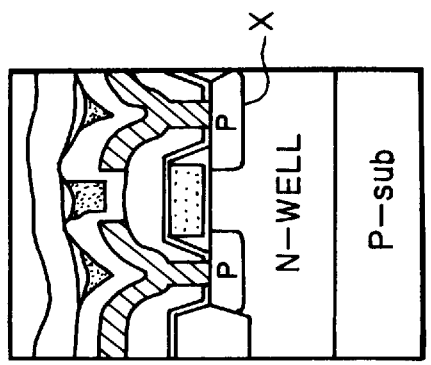
FIG. 13E is a cross-sectional view for explaining the V-I characteristics of FIG. 13B.
Figure 13D:
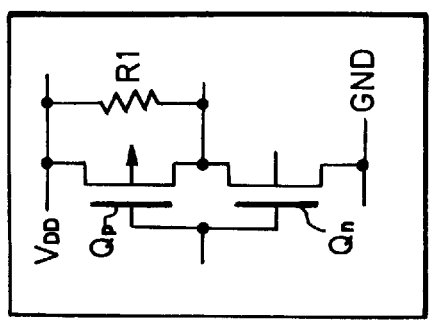
FIG. 13D is a circuit diagram for explaining the V-I characteristiscs of FIG. 13B.

Note that a PN junction failure mode such as a PN junction short-circuit and alloy spike incurred by eutectic reaction between silicon and aluminum can be forcibly made in the device 1 by using an FIB, an electron beam (EB), or excimer laser. For example, as shown in FIG. 13D and 13E, a PN junction failure mode in forcibly made in a P-channel MOS transistor $Q_p$ of a CMOS inverter. In more detail, a PN junction between a P-type drain of the P-channel MOS transistor $Q_p$ and an N-type well is destroyed as indicated by X in FIG. 13E. As a result a small resistance R1 is present between the drain and source of the P-channel MOS transistor $Q_p$. In FIG. 13D, when a high input voltage is applied to the CMOS inverter, a penetration current flows from the power supply voltage terminal $V_{DD}$ via the resistance R1 (the N-type well) and a drain of an N-channel MOS transistor $Q_n$ to the source thereof, i.e., to the ground terminal GND. Also, such a penetration current begins to flow when the input voltage reaches a threshold voltage such as about 1.3 V of the N-channel MOS transistor $Q_n$. In addition, a gradient value of the V-I characteristics is dependent upon a channel resistance of the N-channel MOS transistor $Q_n$. Thus, a PN junction failure mode as shown in FIGS. 13D and 13E has the V-I characteristics as shown in FIG. 13B, where one singular point is generated and one gradient value is very large.

At step 1007, it is determined whether or not an actual fault device failure mode is present. In this case, one or more V-I characteristics showing an actual fault device layer failure are stored as a database in the RAM of the computer 6. It is then determined whether or not the singular points calculated at step 603 are close to those for an actual fault device failure mode. Only if the singular points are close, is it determined whether or not the gradient values calculated at step 603 are close to the gradient values showing an actual fault device failure mode. As a result, if the calculated gradient values are close to those showing an actual fault device layer failure mode, the control proceeds to step 1008 which determines that an actual fault device failure mode has occurred. Then, the control returns via step 1012 to step 605 of FIG. 5. Otherwise, the control proceeds to step 1009.

For example, in order to reduce the resistance of source/drain electrodes, a silicide structure formed by polycrystalline silicon and refractory metal such as Pt and Ti has been used for the source/drain electrodes. In this case, the source/drain electrodes may be peeled off an insulating layer to cause an alloy spike, so that a leakage current flows between a shallow N-type (P-type) region and its surrounding P-type (N-type) well and a short-circuit occurs therebetween. In this case, a penetration current flows through the device 1.

At step 1009, it is determined whether or not a simulated failure mode is present. In this case, one or more V-I characteristics showing a simulated fault device layer failure are stored as a database in the RAM of the computer 6. Therefore, it is determined whether or not the singular points calculated at step 603 are close to those for a simulated failure mode. Only if the singular points are close, is it determined whether or not the gradient values calculated at step 603 are close to the gradient values showing a simulated fault device failure mode. As a result, if the calculated gradient values are close to those showing a simulated fault device layer failure mode, the control proceeds to step 1010 which determines that a simulated fault device failure mode has occurred. Then, the control returns via step 1012 to step 605 of FIG. 5. Otherwise, the control proceeds to step 1011.

Figure 14A:
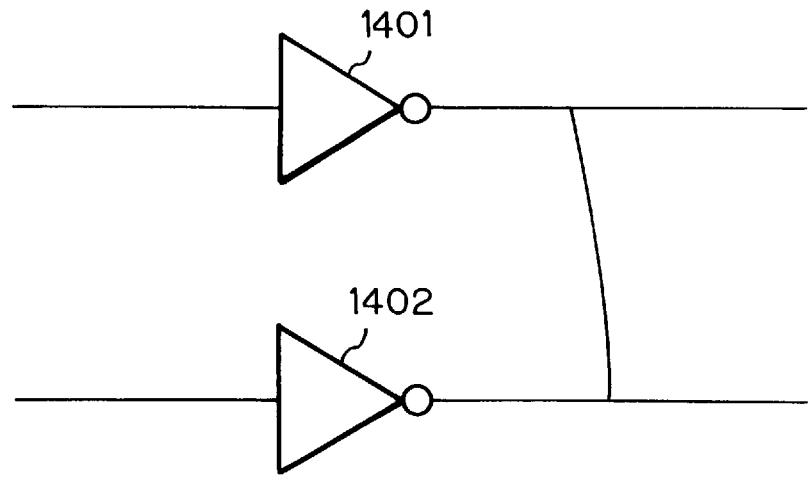
FIG. 14A is a circuit diagram showing an example of V-I characteristics for explaining a simulated fault device failure mode of FIG. 10.
Figure 14B:
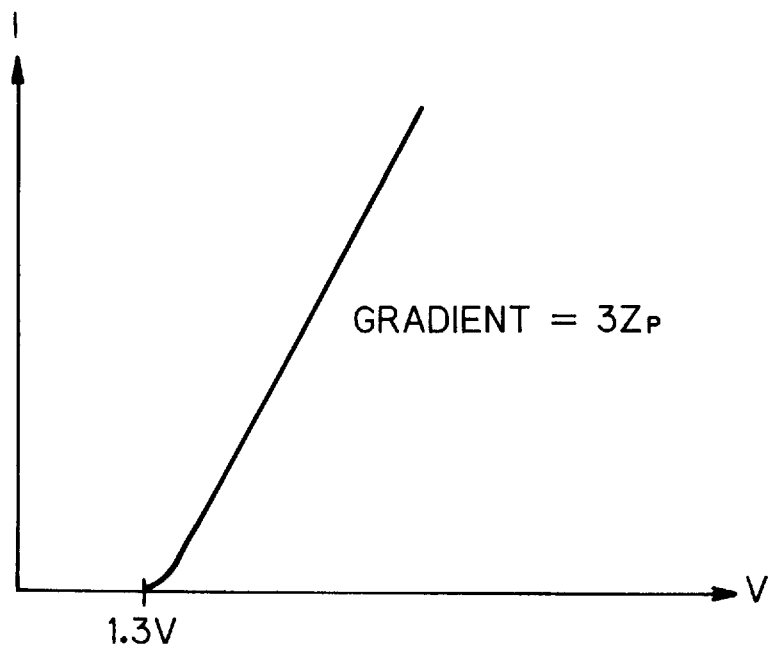
FIG. 14B is a diagram of the V-I characteristics of the circuit of FIG. 14A.

For example, assume that outputs of two CMOS inverters 1401 and 1402 are short-circuited as illustrated in FIG. 14A. In this case, when the output level of the CMOS inverter 1401 is opposite to that of the CMOS inverter 1402, a penetration current flows therethrough. Therefore, such a penetration current begins to flow when the voltage $V_{DD}$ reaches a threshold voltage of a P-channel MOS transistor or an N-channel MOS transistor such as about 1.3 V. Also, since the impedance $Z_n$ of the N-channel MOS transistor is conventionally twice the impedance $Z_p$ of the P-channel MOS transistor, a gradient value of the V-I characteristics is about $3Z_p$. Thus, the V-I characteristics as shown In FIG. 14B where one singular point is generated and one gradient value $3Z_p$ is generated are stored as a database in the RAM or the computer 6.

At step 1011, a flag FX is caused to be "0", while at step 1012, the flag FX is caused to be "1". Therefore, at step 605 of FIG. 6, the determination of a failure mode is carried out by determining whether the flag EX is "1" or "0".

A first example of the environment accelerating step 606, the V-I characteristics detecting step 607 and the failure mode estimating step 608 of FIG. 6 is explained next with reference to FIGS. 15A and 15B.

That is, at step 606, a definite voltage is applied to the power supply terminal voltage terminal $V_{DD}$ for a predetermined time period. Then, at step 607, V-I characteristics are obtained in a similar way as at step 604. Then, at step 608, it is determined whether or not the singular points and the gradient values calculated at step 607 are close to special values showing the V-I characteristics as indicated by a dotted line in FIG. 15A. As a result, only if the singular points and the calculated gradient values are close to the special values, is it determined that a special failure mode has occurred. Then, the control proceeds to step 609 of FIG. 6.

Figure 15A:
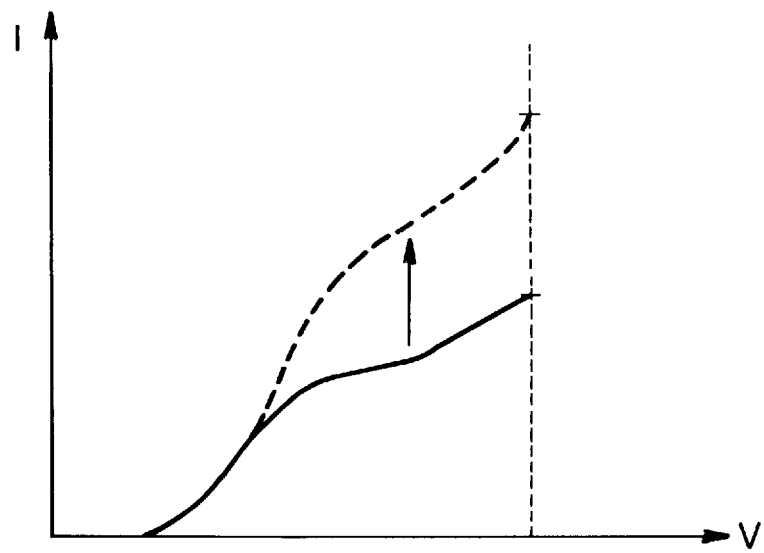
FIG. 15A is a diagram showing a first example of the V-I characteristics at step 608 of FIG. 6.
Figure 15B:
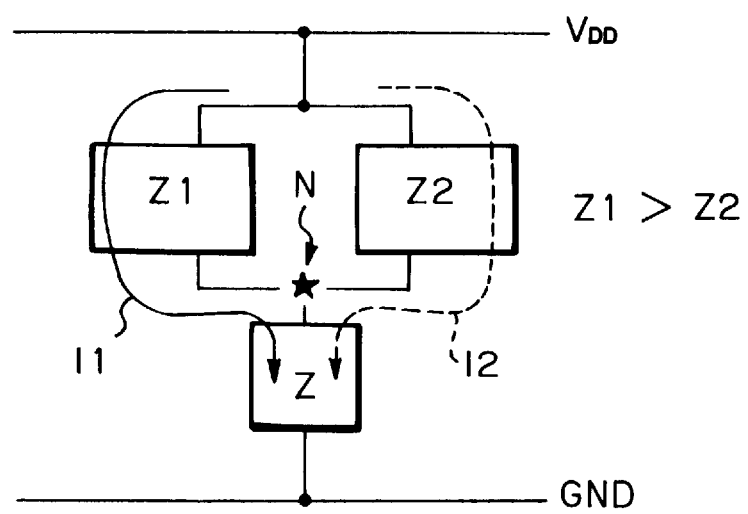
FIG. 15B is a circuit diagram for explaining a failure mode in the first example of FIG. 15A.

For example, as illustrated in FIG. 15B where the special failure mode as shown in FIG. 15A may occur impedance elements Z1 and Z2 are connected in parallel between the power supply voltage terminal $V_{DD}$ and a node N, and an impedance element Z is connected between the node N and the ground terminal GND. In FIG. 15B, assume that the node N is faulty. In this case, first, a penetration current I1 flows from the power supply voltage terminal $V_{DD}$ via the impedance element Z1, the node N and the impedanc element Z to the ground terminal GND. However, after the application of the definite voltage, the impedance around the node N is reduced, a penetration current I2 flows from the power supply voltage terminal $V_{DD}$ via the impedance element Z2, the node N and the impedance element Z to the ground terminal GND. Thus, a change occurs in the V-I characteristics as shown in FIG. 15A, which increases the penetration current, i.e., the quiescent $V_{DD}$ supply current $I_{ddq}$.

A second example of the environment accelerating step 606, the V-I characteristics detecting step 607 and the failure mode estimating step 608 of FIG. 6 is explained next with reference to FIG. 16.

That is, at step 606, the penetration current is controlled at a definite value for a predetermined time period. Then, at step 607, V-I characteristic are obtained in a similar way as at step 604. Then, at step 608, it is determined whether or not the singular points and the gradient values calculated at step 607 are close to special values showing the V-I characteristics as indicated by a dotted line in FIG. 16. As a result, only if the singular points and the calculated gradient values are close to the special values, is it determined that a special failure mode has occurred. Then, the control proceeds to step 609 of FIG. 6.

Note that the second example is effective, since disconnections by electromigration generated in slim connections and other failure modes are caused.

Figure 16:
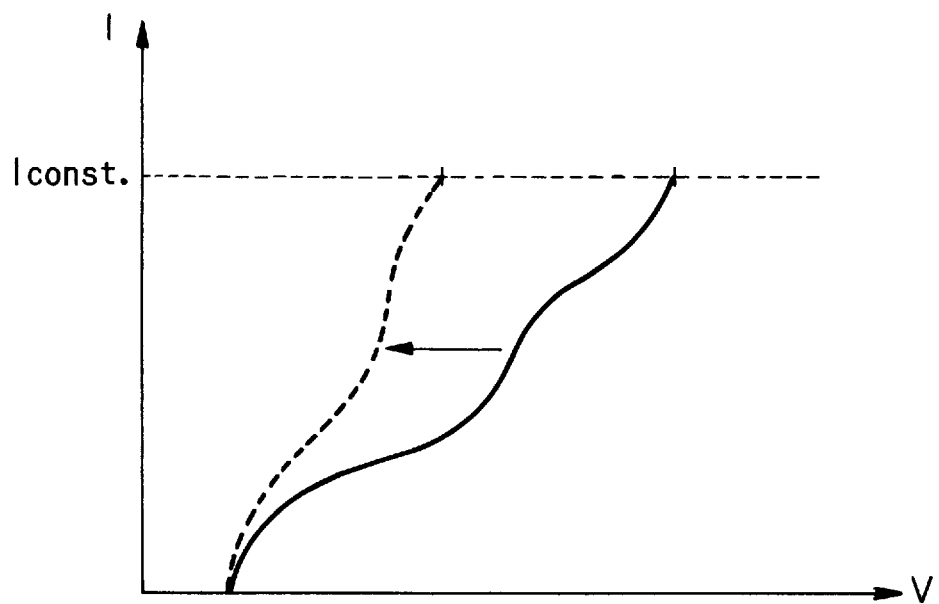
FIG. 16 is a diagram showing a second example of the V-I characteristics at step 608 of FIG. 6.

Thus, in the second example, a change occurs in the V-I characteristics as shown in FIG. 16, which increases the penetration current, i.e., the quiescent $V_{DD}$ supply current $I_{ddq}$.

A third example of the environment accelerating step 606, the V-I characteristics detecting step 607 and the failure mode estimating step 608 of FIG. 6 is explained next with reference to FIGS. 17A, 17B, 17C and 18.

That is, at step 606, the computer 6 controls the voltage generating circuit 2 so that a pulse voltage as shown in FIG. 17A is superposed onto a voltage V as shown in FIG. 17B. As a result, the voltage generating circuit 2 generates a pulse-shaped voltage as shown in FIG. 17C. In this case, since a forward bias voltage of a PN junction is generally 0.65 to 0.7 V, the amplitude of the pulse voltage as shown in FIG. 17A is preferably smaller than about 0.5 V. Then, at step 607, V-I characteristics are obtained in the same way as in step 604. Then, at step 608, it is determined whether or not the singular points and the gradient values calculated at step 607 are close to special values showing the V-I characteristics as indicated by a dotted line in FIG. 18. As a result, only if the singular points and the calculated gradient values are close to the special values, is it determined that a special failure mode has occurred. Then, the control proceeds to step 609 of FIG. 6.

For example, as shown in FIG. 18, in the third example, the V-I characteristics are changed from a solid line to a dotted line. That is, peaks at 0.2 V and 1.8 V show that a PN junction in the path of a penetration current is forwardly-biased. The forward-vias state of such a PN junction means that a physical defect is present in a semiconductor substrate or a short-circuit has occurred between a well and a connection. Thus, a change occurs in the V-I characteristics as shown in FIG. 18, which increases the penetration current, i.e., the quiescent $V_{DD}$ supply current $I_{ddq}$.

A fourth example of the environment accelerating step 606, the V-I characteristics detecting step 607 and the failure mode estimating step 608 of FIG. 6 is explained next with reference to FIG. 19.

That is, at step 606, the computer 6 controls the voltage generating circuit 2 so that the voltage V thereof is reversed. Then, at step 607, V-I characteristics are obtained in the same way as at step 604. Then, at step 608, it is determined whether or not the singular points and the gradient values calculated at step 607 are close to special values showing the V-I characteristics as indicated by a dotted line in FIG. 19. As a result, only if the singular points and the calculated gradient values are close to the special values, is it determined that a special failure mode such as a short-circuit between the power supply voltage terminal $V_{DD}$ and the ground terminal GND or a PN junction breakdown has occurred. Then, the control proceeds to step 609 of FIG. 6.

Figure 19:
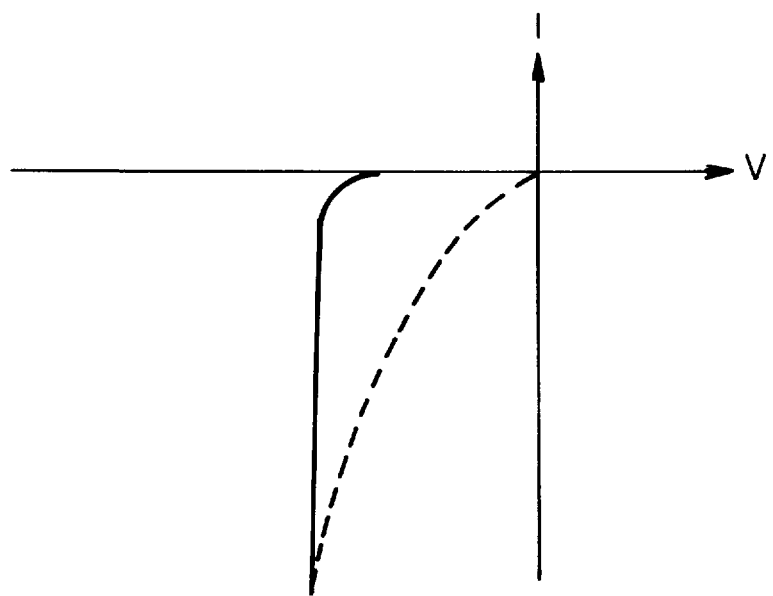
FIG. 19 is a diagram showing a fourth example of the V-I characteristics at step 608 of FIG. 6.

Note that a solid line in FIG. 19 indicates a normal state.

Thus, a change occurs in the V-I characteristics as shown in FIG. 19, which increases the penetration current, i.e., the quiescent $V_{DD}$ supply current $I_{ddq}$.

A fifth example of the environment accelerating step 606, the V-I characteristics detecting step 607 and the failure mode estimating step 608 of FIG. 6 is explained next with reference to FIGS. 20A, 20B and 21.

Figure 20A:
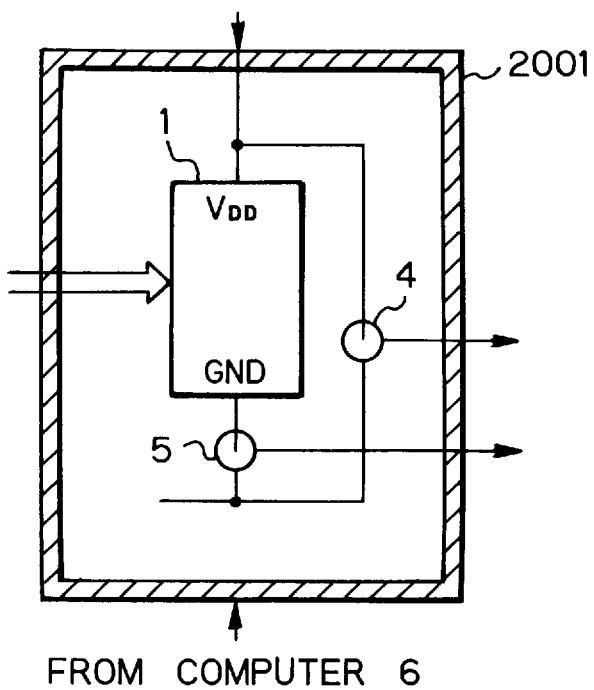
FIG. 20A is a diagram showing a constant-temperature chamber for encapsulating the device of FIG. 5 for explaining a fifth example of the V-I characteristics at step 608 of FIG. 6.

As illustrated in FIG. 20A, the device 1 is put in advance into a constant-temperature chamber 2001 whose temperature is controlled by the computer 6.

That is, at step 606, the computer 6 controls the temperature of the constant-temperature chamber 2001, so that this temperature is brought clove to a predetermined value. Then, at step 607, V-I characteristics are obtained in the same way as at step 604. Then, at step 608, it is determined whether or not the singular points and the gradient values calculated at step 607 are close to special values showing the V-I characteristics as indicated by a dotted line in FIG. 20B. As a result, only if the singular points and the calculated gradient values are close to the special values, is it determined that a special failure mode has occurred. Then, the control proceeds to step 609 of FIG. 6.

Figure 20B:
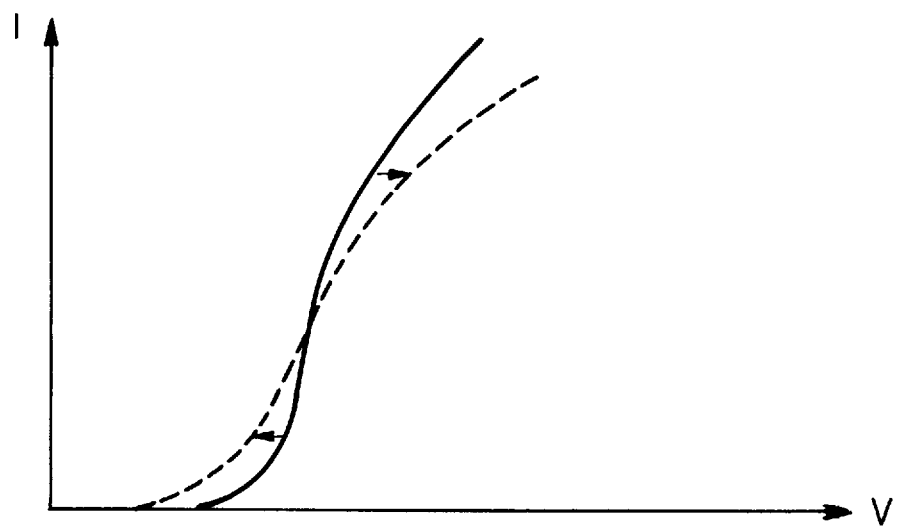
FIG. 20B is a diagram showing the fifth example of the V-I characteristics at step 608 of FIG. 6.

That is, as shown in FIG. 20B, in the fifth example, the V-I characteristics are changed from a solid line to a dotted line, if an open failure of a gate electrode or a PN junction failure is present in the device 1. Generally, the larger the resistance of a channel, the higher the temperature of the constant-temperature chamber 2001. Also, the smaller the threshold voltage, the higher the temperature of the contant-temperature chamber 2001. An example of this failure is shown in FIG. 21.

Figure 21:
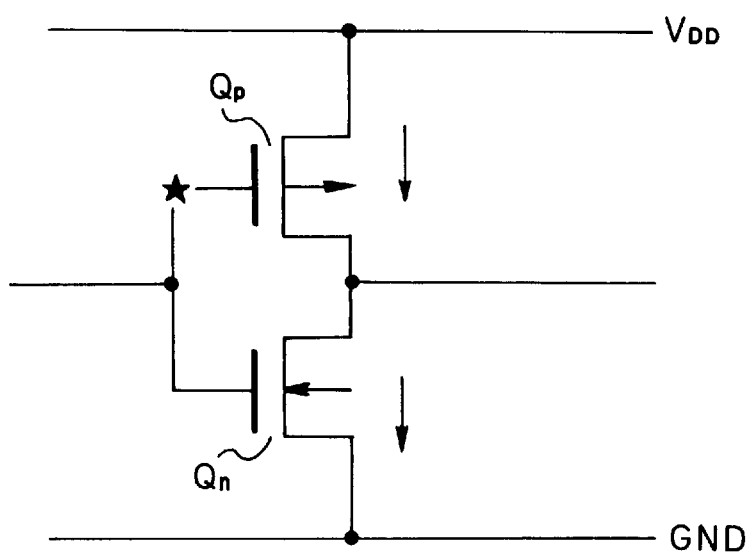
FIG. 21 is a circuit diagram for explaining a failure mode in the fifth example of FIG. 20B.

In FIG. 21, a CMOS inverter is comprised of a P-channel MOS transistor $Q_p$ and an N-channel MOS transistor $Q_n$, and an open failure occurs in the gate electrode of the P-channel MOS transistor $Q_p$. In this case, when a high input voltage is applied to the CMOS inverter, the P-channel MOS transistor $Q_p$ is normally in an ON state and an N-channel MOS transistor $Q_n$ is turned ON, so that a penetration current flows therethrough. In addition, when the temperature of the contant-temperature chamber 2001 is increased, the channel resistance of the normally-ON state P-channel MOS transistor $Q_p$ is increased and the threshold voltage of the N-channel MOS transistor $Q_n$ is decreased. As a result, a change occurs in the V-I characteristics as shown in FIG. 20B, which increases the penetration current, i.e., the quiescent $V_{DD}$ supply current $I_{ddq}$.

A sixth example of the environment accelerating step 606, the V-I characteristics detecting step 607 and the failure mode estimating step 608 of FIG. 6 is explained next with reference to FIG. 22.

Figure 22:
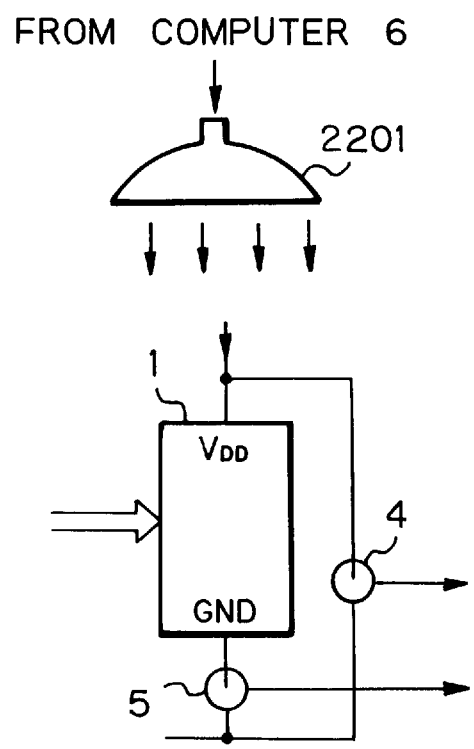
FIG. 22 is a diagram showing a light source chamber for the device of FIG. 5 for explaining a sixth example of the V-I characteristics at step 608 of FIG. 6.

As illustrated in FIG. 22, the device 1 is put in advance under a light source 2201 which is controlled by the computer 6.

That is, at step 606, the computer 6 turns ON the light source 2201. Then, at step 607, V-I characteristics are obtained in the same way as at step 604. Then, at step 608, it is determined whether or not the singular points and the gradient values calculated at step 607 are close to special values. As a result, only if the singular points and the calculated gradient values are close to the special values, is it determined that a special failure mode has occurred. Then, the control proceeds to step 609 of FIG. 6.

For example, when light is irradiated onto the device 1, electrons in the viscidity of PN junctions are made active so that the impedance between the power supply voltage terminal $V_{DD}$ and the ground terminal GND is decreased and the threshold voltage of the PN junctions is decreased. Thus, a change occurs in the V-I characteristics which increases the penetration current, i.e., the quiescent $V_{DD}$ supply current $I_{ddq}$.

A seventh example of the environment accelerating step 606, the V-I characteristics detecting step 607 and the failure mode estimating step 608 of FIG. 6 is explained next with reference to FIG. 23.

Figure 23:
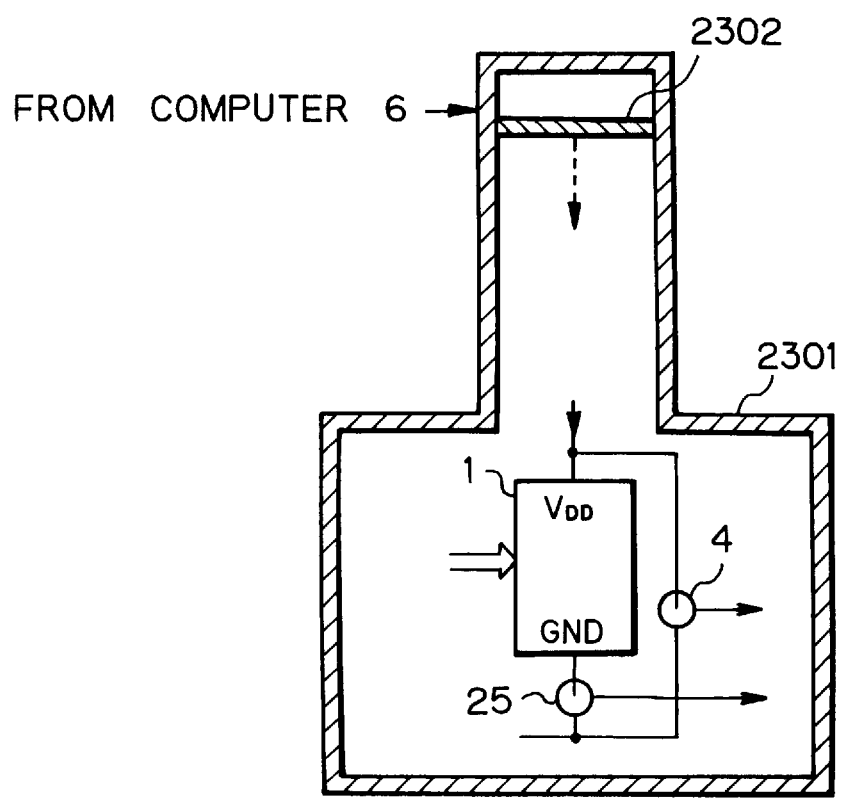
FIG. 23 is a diagram showing an ion inplanting apparatus for the device of FIG. 5 for explaining a seventh example of the V-I characteristics at step 608 of FIG. 6.

As illustrated in FIG. 23, the device 1 is put in advance in a vacuum mirror cylinder 2301 having an ion source 2302 which is controlled by the computer 6.

That in, at step 606, the computer 6 activates the ion source 2302. Then, at step 607, V-I characteristics are obtained in the same way as at step 604. Then, at step 608, it is determined whether or not the singular points and the gradient values calculated at step 607 are close to special gradient values. As a result, only if the singular points and the calculated gradient values are close to the special values, is it determined that a special failure mode has occurred. Then, the control proceeds to step 609 of FIG. 6.

For example, when ions is irradiated onto the device 1 comprised of a CMOS inverter as illustrated in FIG. 21, ions are accumulated in the gate electrode of the P-channel transistor $Q_p$ so that the P-channel MOS transistor $Q_p$ is turned OFF, thus decreasing the penetration current. Thus, a change occurs in the V-I characteristics which decreases the penetration current, i.e., the quiescent $V_{DD}$ supply current $I_{ddq}$.

An eighth example of the environment acclerating step 606, the V-I characteristics detecting step 607 and the failure mode estimating step 608 of FIG. 6 is explained next with reference to FIG. 24.

Figure 24:
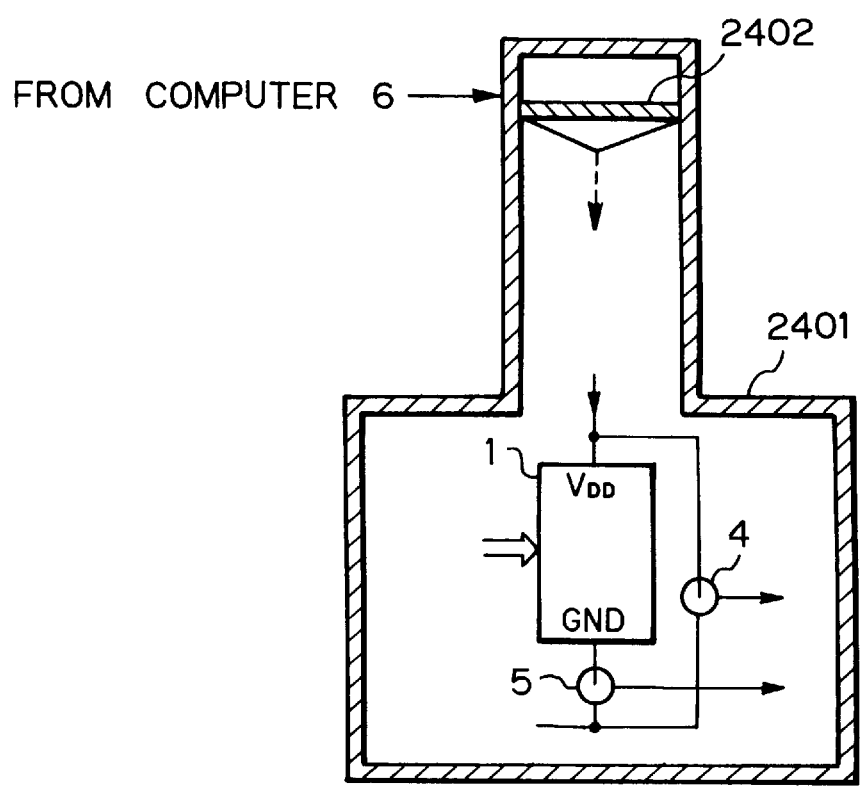
FIG. 24 is a diagram showing an electron beam apparatus for the device of FIG. 5 for explaining an eighth example of the V-I characteristics at step 608 of FIG. 6.

As illustrated in FIG. 24, the device 1 is put in advance a vacuum mirror cylinder 2401 having an electron gun 2402 which is controlled by the computer 6.

That is, at step 606, the computer 6 activates the electron gun 2402. Then, at step 607, V-I characteristic are obtained in the same way as at step 604. Then, at step 608, it is determined whether or not the singular points and the gradient values calculated at step 607 are close to special values. As a result, only if the singular points and the calculated gradient values are close to the special values, is it determined that a special failure mode has occurred. Then, the control proceeds to step 609 of FIG. 6.

For example, when electrons is irradiated onto the device 1 comprised of a CMOS inverter as illustrated in FIG. 21, electrons are accumulated in the gate electrode of the P-channel MOS transistor $Q_p$ so that the P-channel MOS transistor $Q_p$ is moved to be turned ON, thus increasing the penetration current. On the other hand, assume that the gate electrode of the N-channel MOS transistor $Q_n$ is open. In this case, electrons are accumulated in the gate electrode of the N-channel MOS transistor $Q_n$ so that the N-channel MOS transistor $Q_n$ is turned OFF, thus decreasing the penetration current. Thus, a change occurs in the V-I characteristics which increases or decreases the penetration current, i.e., the quiescent $V_{DD}$ supply current $I_{ddq}$.

As explained hereinabove, according to the present invention, a failure mode of a semiconductor device can be easily and rapidly estimated without destroying the device.

I claim:

1. A system for estimating a failure mode in a semiconductor device, comprising:

means for generating at least one functional test pattern and transmitting said functional test pattern to said semiconductor device;

means for detecting an abnormal current flowing through said semiconductor device;

means for detecting V-I characteristics of said semiconductor device, when said abnormal current flows through said semiconductor device; and means for comparing said V-I characteristics with reference V-I characteristics for a specified failure mode, to estimate that said specified failure mode has occurred in said semiconductor device when said V-I characteristics are close to said reference V-I characteristics.

2. The system as set forth in claim 1, wherein said comparing means compares singular points and gradient values of said V-I characteristics with gradient values of said reference V-I characteristics.

3. The system as set forth in claim 1, wherein said specified failure mode is based upon a physical failure mode forcibly made in said semiconductor device.

4. The system as set forth in claim 1, wherein said specified failure mode is a conductive layer failure mode.

5. The system as set forth in claim 1, wherein said specified failure mode is a cross-sectional structure failure mode.

6. The system as set forth in claim 1, wherein said specified failure mode is a PN junction failure mode.

7. The system as set forth in claim 1, wherein said specified failure mode is an actual fault device failure mode.

8. The system as set forth in claim 1, wherein said specified failure mode is a simulated fault device failure mode.

9. The system as set forth in claim 1, further comprising means for changing an environment of said semiconductor device, said V-I characteristics detecting means detecting said V-I characteristics after said environment of said semiconductor device is changed.

10. The system as set forth in claim 9, wherein said environment changing means applies a definite voltage to said semiconductor device for a certain time period.

11. The system as set forth in claim 9, wherein said environment changing means controls a current flowing through said semiconductor device at a definite value for a certain time period.

12. The system as set forth in claim 9, wherein said environment changing means adds a pulse voltage to a voltage applied to said semiconductor device.

13. The system as set forth in claim 9, wherein said environment changing means inverts a polarity of a voltage applied to said semiconductor device.

14. The system as set forth in claim 9, wherein said environment changing means changes a temperature of said semiconductor device.

15. The system as set forth in claim 9, wherein said environment changing means irradiates said semiconductor device with light.

16. The system as set forth in claim 9, wherein said environment changing means irradiates said semiconductor device with ions.

17. The system as set forth in claim 9, wherein said environment changing means irradiates said semiconductor device with electrons.

18. The system as set forth in claim 1, wherein said semiconductor device is a CMOS integrated device.

* * * * *